United States Patent
Tavkhelidze

(10) Patent No.: US 9,105,669 B2
(45) Date of Patent: Aug. 11, 2015

(54) MOS TRANSISTOR ON THE BASIS OF QUANTUM INTERFERANCE EFFECT

(76) Inventor: Avto Tavkhelidze, Tbilisi (GE)

(*) Notice: Subject to any disclaimer, the term of this patent is extended or adjusted under 35 U.S.C. 154(b) by 660 days.

(21) Appl. No.: 12/283,378

(22) Filed: Sep. 11, 2008

(65) Prior Publication Data

US 2009/0072219 A1 Mar. 19, 2009

(30) Foreign Application Priority Data

Sep. 14, 2007 (GB) .................................. 0717976.5

(51) Int. Cl.
| | | |
|---|---|---|
| *H01L 29/775* | (2006.01) | |
| *H01L 29/66* | (2006.01) | |
| *H01L 49/00* | (2006.01) | |
| *B82Y 10/00* | (2011.01) | |
| *H01L 29/12* | (2006.01) | |

(52) U.S. Cl.
CPC .......... *H01L 29/66977* (2013.01); *B82Y 10/00* (2013.01); *H01L 49/006* (2013.01); *H01L 29/125* (2013.01); *H01L 29/66439* (2013.01); *H01L 29/775* (2013.01)

(58) Field of Classification Search
CPC ............ H01L 29/125; H01L 29/66439; H01L 29/66977; H01L 29/775; H01L 49/006; B82Y 10/00
USPC ........ 257/9, 623, E29.006, E29.168, E49.003
See application file for complete search history.

(56) References Cited

U.S. PATENT DOCUMENTS

| | | | | |
|---|---|---|---|---|
| 4,395,726 A | * | 7/1983 | Maeguchi | 257/351 |
| 5,293,058 A | * | 3/1994 | Tsividis | 257/364 |
| H1570 H | * | 8/1996 | Lux et al. | |
| 2004/0227185 A1 | * | 11/2004 | Matsumoto et al. | 257/347 |
| 2005/0090048 A1 | * | 4/2005 | Kreps | 438/197 |
| 2005/0093033 A1 | * | 5/2005 | Kinoshita et al. | 257/288 |
| 2006/0163672 A1 | * | 7/2006 | Wang et al. | 257/396 |
| 2006/0194387 A1 | * | 8/2006 | Wang et al. | 438/257 |
| 2007/0215861 A1 | * | 9/2007 | Stafford et al. | 257/24 |
| 2008/0224124 A1 | * | 9/2008 | Tavkhelidze | 257/30 |
| 2009/0020764 A1 | * | 1/2009 | Anderson et al. | 257/77 |
| 2010/0188905 A1 | * | 7/2010 | Poeppel et al. | 365/185.28 |

OTHER PUBLICATIONS

Sordan, R. et al. "The Nonlinear Transport Regime of a T-Shaped Quantum Interference Transistor." Appl. Phys. Lett. 68 (25), pp. 3599-3601. Jun. 17, 1996.*

Sols, F. et al. "On the Possibility of Transistor Action Based on Quantum Interference Phenomena." Appl. Phys. Lett. 54 (4), pp. 350-352. Jan. 23, 1989.*

(Continued)

*Primary Examiner* — Tom Thomas
*Assistant Examiner* — Christopher M Roland

(57) ABSTRACT

A new type of Metal Oxide Semiconductor (MOS) transistor that works on the basis of the Quantum Interference Depression (QID) effect is disclosed. QID occurs inside an n-type semiconductor source-drain electrode of special geometry. Due to QID the Fermi level of said semiconductor increases locally inside the source drain electrode, thereby creating a localized potential energy barrier in the path of electrons moving from source to drain regions. The height of the barrier depends on the degree of QID. QID is in turn regulated by the gate voltage via the charge depletion and hence change in effective dimensions of the special geometry of the semiconductor electrode. A gate voltage modulated potential energy barrier and is thus formed whereby current in said MOS transistor is controlled.

9 Claims, 2 Drawing Sheets

(56) References Cited

OTHER PUBLICATIONS

Tavkhelidze, A. et al. "Quantum Interference Depression in Thin Metal Films with Rigid Surface." Vacuum Nanoelectronics Conference, pp. 46-47. 2007.*

Tavkhelidze, A. et al. "Fermi Gas Energetics in Low-Dimensional Metals of Special Geometry." J. Vac. Sci. Technol. B 25(4), pp. 1270-1275. Jul./Aug. 2007.*

Tavkhelidze, A. et al. "Observations of Quantum Interference Effects in Solids." J. Vac. Sci. Technol. B 24(3), pp. 1413-1416. May/Jun. 2006.*

* cited by examiner

MOS TRANSISTOR ON THE BASIS OF QUANTUM INTERFERANCE EFFECT

CROSS-REFERENCE TO RELATED APPLICATIONS

This application claims the benefit of U.K. Patent Application No. GB0717976.5, filed Sep. 14, 2007, said document incorporated herein in its entirety by reference.

BACKGROUND OF THE INVENTION

Much research has been devoted in recent years to the development of quantum transistors. Proposed devices include the Aharonov-Bohm quantum phase transistor, quantum well transistor, quantum-tunneling transistor, and quantum diffraction transistor. It is an object of the present invention to provide a novel form of a MOS transistor based on a quantum interference effect.

A new low dimensional quantum effect (QID) was predicted theoretically and observed experimentally in solids. QID is based on electron de Broglie wave interference due to special geometry of a solid. Quantum interference causes some quantum states inside the solid to become forbidden, as a result of which the Fermi energy level increases. The magnitude of the change in the Fermi level depends on the exact dimensions of the special geometry of the solid. QID has been observed in a range of materials, including semiconductor materials.

Previously, it was known that quantum interference effects appeared because of a series of protrusions on the surface of a material. More recently it has been shown that quantum interference also occurs due to the presence of a single protrusion.

U.S. Pat. Nos. 6,281,514, 6,495,843, and 6,531,703 disclose methods for promoting the passage of electrons at or through a potential barrier comprising providing a potential barrier having a geometrical shape for causing quantum interference of electron de Broglie wave. Also provided is an electron-emitting surface having a series of indents, the depth of which is chosen so that the probability wave of the electron reflected from the bottom of the indent interferes destructively with the probability wave of the electron reflected from the surface. This results in the increase of tunneling through the potential barrier. A further embodiment provides a method for making an electron-emitting surface having a series of indents.

U.S. Pat. No. 6,680,214 and U.S. Patent. App. Pub. No. 2004/0206881 disclose methods for the induction of a suitable band gap and electron emissive properties into a substance, in which the substrate is provided with a surface structure corresponding to the interference of de Broglie waves.

WO99/064642 discloses a method for fabricating nanostructures directly in a material film, preferably a metal film, deposited on a substrate.

WO04/040617 discloses a method that blocks movement of low energy electrons through a thermoelectric material. This is achieved using a filter that is more transparent to high-energy electrons than to low energy ones. Tunnel barrier on the path of the electrons is used as filter. The filter works on the basis of the wave properties of the electrons. The geometry of the tunnel barrier is such that the barrier becomes transparent for electrons having certain de Broglie wavelength. If the geometry of the barrier is such that its transparency wavelength matches the wavelength of high-energy electrons it will be transparent for high-energy electrons and will be blocking low energy ones by means of tunnel barrier.

U.S. Pat. No. 7,074,498 discloses the use of electrodes having a modified shape and a method of etching a patterned indent onto the surface of a modified electrode, which increases the Fermi energy level inside the modified electrode, leading to a decrease in electron work function. The surface configuration of the modified electrode may resemble a corrugated pattern of squared-off, "u"-shaped ridges and valleys or a regular pattern of rectangular "plateaus" or "holes". The surface configuration comprises a substantially plane slab of a material having on one surface one or more indents of a depth approximately 5 to 20 times the roughness of said surface and a width approximately 5 to 15 times said depth. Typically the depth of the indents is $\geq \lambda/2$ and the width of the indents is $\gg \lambda$ wherein $\lambda$ is the de Broglie wavelength. The thickness of the slab is typically a multiple of the depth, preferably between 5 and 15 times said depth, and in the range 15 to 75 nm.

BRIEF SUMMARY OF THE INVENTION

A new type of Metal Oxide Semiconductor (MOS) transistor that works on the basis of the Quantum Interference Depression (QID) effect is disclosed. QID occurs inside an n-type semiconductor source-drain electrode of special geometry. Due to QID the Fermi level of said semiconductor increases locally inside the source drain electrode, thereby creating a localised potential energy barrier in the path of electrons moving from source to drain regions. The height of the barrier depends on the degree of QID. QID is in turn regulated by the gate voltage via the charge depletion and hence change in effective dimensions of the special geometry of the semiconductor electrode. A gate voltage modulated potential energy barrier is thus formed whereby current in said MOS transistor is controlled. In accordance with the present invention there is provided a MOS transistor of special geometry, utilizing QID. The MOS transistor of the present invention comprises a semiconductor source-drain electrode with a protrusion between its source and drain regions. Contiguous with the protrusion is an insulating layer and metal gate, as in conventional MOS transistors. Provided the protrusion is of appropriate dimensions, QID occurs within the protrusion, causing the Fermi level to increase locally inside the source drain electrode. A local potential energy barrier is thus created along the path of electrons moving from the source to drain regions inside the semiconductor electrode. The size of the potential energy barrier depends on the degree of QID which depends in turn on the dimensions of the protrusion. The application of a gate voltage of appropriate size and polarity causes charge depletion in the protrusion, thereby changing the effective height of the protrusion and thus altering QID. A gate voltage regulated potential energy barrier is thus formed in the path of electrodes moving from the source to drain regions.

Objects and advantages will become apparent from the following detailed description to be read in connection with the accompanying drawings.

BRIEF DESCRIPTION OF THE SEVERAL VIEWS OF THE DRAWING

For a more complete explanation of the present invention and the technical advantages thereof, reference is now made to the following description and the accompanying drawings in which.

DETAILED DESCRIPTION OF THE INVENTION

Figure 1:
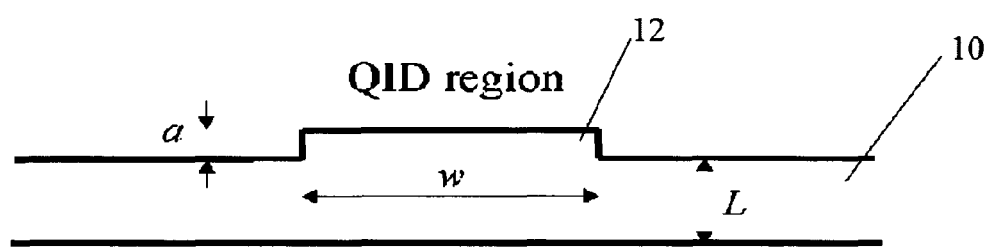
FIG. 1 shows a schematic of a semiconductor film with a protrusion.
Figure 2:
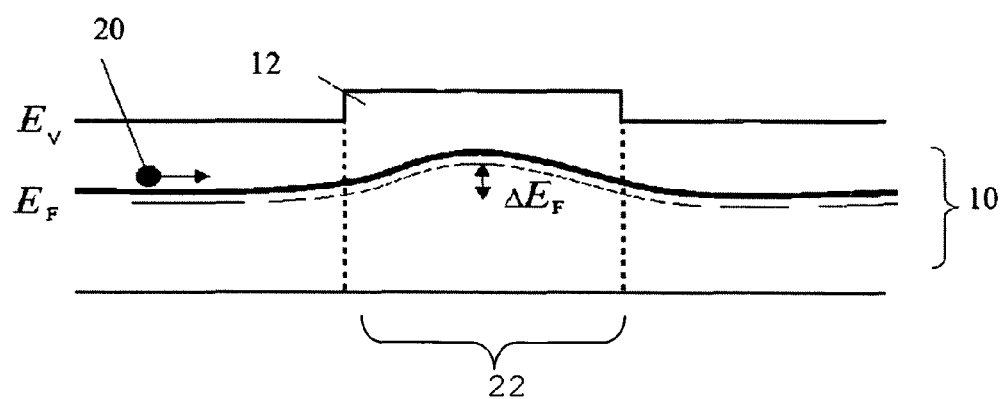
FIG. 2 shows a diagrammatic representation of an electron moving inside a semiconductor film having a region of increased Fermi level due to a protrusion.
Figure 3:
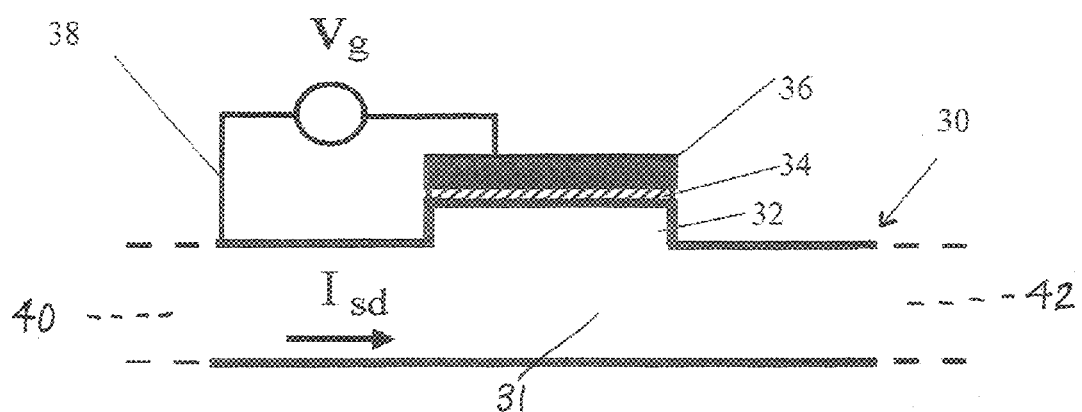
FIG. 3 shows a schematic of a MOS transistor of the present invention.

Embodiments of the present invention and their technical advantages may be better understood by referring to FIGS. 1, 2, and 3.

Referring now to FIG. 1, which shows a semiconductor film having a protrusion. Shown is a semiconductor film 10 of thickness L with single protrusion 12 of thickness a and width w formed on its surface. If the total film thickness L+a is less than the electron mean free path, then an electron inside the semiconductor film 10 can be regarded as a de Broglie wave and interference effects that work on the basis of Quantum Interference Depression will take place in a region below protrusion 12.

Referring now to FIG. 2, which is a diagrammatic representation of an electron moving inside a semiconductor film having a region of increased Fermi level. Shown is electron 20 moving inside semiconductor film 10 containing region of increased Fermi level 22 beneath protrusion 12. The Fermi level and correspondingly the bottom of the conduction band are seen to increase locally whilst remaining at normal values distally. Consider electron 20 moving from source region 40 to drain region 42 inside semiconductor film 10. Electron 20 must overcome a potential energy barrier due to increased Fermi level 22 in order to continue movement in the direction shown.

The energy required in order to overcome the potential energy barrier is given by $$E > E_F + \Delta E_F + \epsilon/2 \quad (1)$$

where E is the energy required. $E_F$ is the Fermi level of semiconductor 10, $\Delta E_F$ is the potential barrier height due to increased Fermi level 22 and $\epsilon$ is the band gap width.

One of the ways in which electron 20 can be provided with the requisite energy E in order to cross the potential energy barrier is through the application of a voltage $V_{sd}$ between source and drain regions in semiconductor 10. On the application of a sufficiently large $V_{sd}$, electron 20 is provided with enough energy to cross the potential energy barrier and a current $I_{sd}$ flows. The magnitude of $I_{sd}$ depends on $\Delta E_F$ and $V_{sd}$. Thus, $I_{sd}$ can be expressed as $$I_{sd} = f(\Delta E_F, V_{sd}) \quad (2)$$

However; equation (2) can be further broken down since, as described in the prior art, $\Delta E_F$ is itself a function of the dimensions of protrusion 12 on the surface of semiconductor film 10. According to a simplified theoretical model, the dependency of $\Delta E_F$ on protrusions' 12 dimensions is given by $$\Delta E_F = \alpha_n E_F [(L\sigma/aw)^{2/3} - 1] \quad (3)$$

where $\Delta E_F$ is the potential barrier height, $E_F$ is the Fermi energy in areas remote from the protrusion, L a and w are dimensions as depicted in FIG. 1, $\sigma$ is the mean free path of an electron and $\alpha_n$ is constant. $\alpha_n$ depends on non-regularities inside the source-drain channel and surface roughness.

Equation 3 shows a strong dependence of the potential barrier height on protrusion thickness a. A change in protrusion thickness would thus cause a change in QID and the potential barrier height, thereby regulating $I_{sd}$ in accordance with equation 2. This is the basis of the present invention, a possible embodiment of which is shown in FIG. 3.

Referring now to FIG. 3, which shows a schematic of a MOS transistor of the present invention. Shown is semiconductor film 30 with a single protrusion 32. A thin insulating layer 34 is disposed on the surface of protrusion 32. A thin conducting layer or gate 36 is disposed on the surface of insulating layer 34. Electrical contacts 38 connect semiconductor film 30 to gate 36 allowing gate voltage Vg to be applied therebetween.

Consider current $I_{sd}$ flowing through semiconductor film 30, as described in reference to FIG. 2. Vg is now applied. In a preferred embodiment of the present invention Vg is of polarity so as to create a negative charge on gate 36. Electrons in semiconductor film 30 are repelled away from gate 36 due to electrostatic repulsion. This effect is felt most strongly at the top of protrusion 32 due to its proximity to gate 36 and decreases in strength with increasing distance from gate 36. Electrons at the top of protrusion 32 are thus pushed downwards into semiconductor film 30 and a region of charge depletion is created at the top of protrusion 32. The effective height of protrusion 32 is thereby reduced, with the reduction in height equal to the height of the newly created charge depletion region.

According to the theory outlined above and expressed quantitatively in equation 3, the charge depletion region created as a result of Vg and the consequent change in height of protrusion 32 has the effect of increasing the size of $\Delta E_F$. For a given source-drain voltage, an increase in $\Delta E_F$ results in a decrease in $I_{sd}$ since fewer electrons now have the energy E required to cross the potential energy barrier.

In summary, a gate voltage regulated potential energy barrier is formed in the path of electrons moving in semiconductor film 30, whereby the size of the current in semiconductor film 30 is modulated.

In a particularly preferred embodiment of the present invention semiconductor film 30 contains n-type source and drain regions 40 and 42 and is manufactured with a pre-existing n-type channel 31 present between said source and drain regions. This particularly preferred embodiment of the MOS transistor of the present invention functions in depletion mode, wherein the application of a gate voltage serves to impede current flow by way of charge depletion.

In a further preferred embodiment of the present invention insulating layer 34 comprises silicon dioxide and has a thickness of about 10 nm.

In one possible embodiment of the present invention gate 36 comprises a metal. In another possible embodiment of the present invention, gate 36 comprises polycrystalline silicon.

In a particularly preferred embodiment of the present invention the depth of protrusion 32 is $\geq \lambda/2$, wherein $\lambda$ is the de Broglie wavelength of an electron inside semiconductor film 30. The depth of the protrusion is greater than the surface roughness of the semiconductor surface.

In another possible embodiment of the present invention semiconductor film 30 comprises an n-type semiconductor and contains p-type source and drain regions. This particular embodiment of the present invention functions in enhancement mode, wherein the application of a negative gate voltage has a dual effect. As in a conventional enhancement mode MOS transistor, the negative gate voltage repels electrons, creating a p-type channel between source and drain regions and allowing current to flow. In addition to this effect, however, a second effect unique to the present invention occurs wherein the negative gate voltage creates a region of charge depletion in protrusion 32, whereby the height of protrusion 32 and correspondingly the potential energy barrier changes.

The functioning of this embodiment of the present invention is somewhat complex in that increasing the gate voltage leads to two opposing effects: the channel size increases leading to increased source-drain current and the potential energy barrier size also increases leading to a reduction in source-drain current. The balance of these two effects may allow fine-tuning of the current flow in this embodiment of the present invention.

While having described a specific preferred embodiment of the present invention with reference to the accompanied drawings, it is to be understood that the invention is not limited to that precise embodiment and that various changes and modifications may be effected therein by one skilled in the art without departing from the scope or spirit of the invention as defined in the appended claims.

The invention claimed is:

1. A quantum interference metal oxide semiconductor transistor device, comprising
   a. a semiconductor film comprising n-type source and drain regions or p-type source and drain regions and an n-type channel between said source and drain regions;
   b. a single protrusion having a width w greater than its height a formed integrally with and extending outwardly from a surface of said semiconductor film located between said source and drain regions, wherein the width of said protrusion terminates with walls perpendicular to said surface and edges of said walls are sharp;
   c. a layer of an insulating material disposed on a surface of said protrusion outwardly of said semiconductor film contiguous with said protrusion and having a width equal to the width w of said protrusion;
   d. a layer of a conducting material contiguous with and completely covering said layer of insulating material to form a gate having a width equal to said width w;
   e. electrical contacts connecting said source region of said semiconductor film to said gate adapted to allow a gate voltage $V_g$ to be applied between said source region and said gate; and
   f. a gate regulated potential energy barrier formed in said semiconductor film channel below said protrusion when said gate voltage is applied, wherein an amount of energy E required for an electron moving through a region of increased Fermi level below said protrusion to overcome the potential energy barrier below said protrusion and continue to move through said channel to the drain region is represented by equation (1):

$$E > E_F + \Delta E_F + \epsilon/2 \qquad (1)$$

wherein $E_F$ is a Fermi level of said semiconductor, $\Delta E_F$ is a potential energy barrier increased height due to increased Fermi level, and $\epsilon/2$ is band gap width.

2. The device of claim 1, wherein said gate comprises a material selected from the group comprising metals and polycrystalline silicon.

3. The device of claim 1, wherein said semiconductor film comprises n-type source and drain regions.

4. The device of claim 1, wherein said semiconductor film comprises p-type source and drain regions.

5. The device of claim 1, wherein said height a of said protrusion is greater than surface roughness of the semiconductor surface.

6. The device described in claim 1, wherein said insulating material comprises $SiO_2$ and the thickness of said layer of insulating material is about 10 nm.

7. The device of claim 6, wherein said conducting material comprises a metal or polycrystalline silicon.

8. The device of claim 1, wherein said protrusion and said potential energy barrier are located centrally in said channel between said source region and said drain regions, and said gate voltage is selected to provides sufficient energy to move said electron across the potential energy barrier and to cause current $I_{sd}$ to flow through said semiconductor according to equation (2):

$$I_{sd} = f(\Delta E_F, V_{sd}) \qquad (2)$$

wherein $V_{sd}$ is the gate voltage applied between said source and drain regions.

9. The device of claim 8, wherein said layer of insulating material comprises $SiO_2$ having a thickness of about 10 nm and said width w disposed contiguously on a surface of said protrusion above said region of increased Fermi level, and said layer of conducting material comprises a metal or polycrystalline silicon and having said width w disposed on said layer of insulating material.

* * * * *